United States Patent
Seo et al.

(10) Patent No.: US 12,453,288 B2
(45) Date of Patent: Oct. 21, 2025

(54) METHOD FOR MANUFACTURING FLEXIBLE LAMINATED PIEZOELECTRIC COMPOSITE

(71) Applicant: Korea Electronics Technology Institute, Seongnam-si (KR)

(72) Inventors: Intae Seo, Gwangju-si (KR); Hyung Won Kang, Seoul (KR); Seung Ho Han, Gwacheon-si (KR); Myong Jae Yoo, Seoul (KR); Hyunseung Yang, Incheon (KR)

(73) Assignee: Korea Electronics Technology Institute, Seongnam-si (KR)

( * ) Notice: Subject to any disclaimer, the term of this patent is extended or adjusted under 35 U.S.C. 154(b) by 721 days.

(21) Appl. No.: 17/897,502

(22) Filed: Aug. 29, 2022

(65) Prior Publication Data

US 2023/0081954 A1    Mar. 16, 2023

(30) Foreign Application Priority Data

Sep. 16, 2021 (KR) .................. 10-2021-0124022

(51) Int. Cl.
*H10N 30/853* (2023.01)
*H10N 30/072* (2023.01)
(Continued)

(52) U.S. Cl.
CPC ....... *H10N 30/8542* (2023.02); *H10N 30/072* (2023.02); *H10N 30/088* (2023.02);
(Continued)

(58) Field of Classification Search
CPC ............ H10N 30/8542; H10N 30/072; H10N 30/088; H10N 30/092; H10N 30/8536;
(Continued)

(56) References Cited

U.S. PATENT DOCUMENTS 6,093,338 A  *  7/2000  Tani .................. C04B 35/462
                                                   501/12
6,985,348 B2 *  1/2006  Sato .................. H10N 30/50
                                                   361/321.1
(Continued)

FOREIGN PATENT DOCUMENTS

KR    10-2011-0045435 A    5/2011
KR       10-1442632 B1    9/2014
KR       10-2042638 B1   11/2019

OTHER PUBLICATIONS

Mistler et al.,"Tape Casting, Theory and Practice", 2000, The American Ceramic Society, complete document. (Year: 2000).*
Kim et al., "Application of Ag-Ceramic Composite Electrodes to Low Firing Piezoelectric Multilayer Ceramic Actuators", IFOST2006 Oct. 18-20, 2006, @2006 IEEE, pp. 182-185. (Year: 2006).*
(Continued)

*Primary Examiner* — Emily P Pham
(74) *Attorney, Agent, or Firm* — NSIP Law

(57) ABSTRACT

Disclosed is a method for manufacturing a laminated piezoelectric composite. The method includes wet-mixing ceramic powder, a polymer binder, a plasticizer and a solvent for 4 to 72 hours so as to generate a mixed slurry, introducing the mixed slurry into a tape casting process so as to prepare a plurality of piezoelectric composite sheets, drying and forming the plurality of piezoelectric composite sheets using a roll-to-roll process so as to prepare the plurality of formed piezoelectric composite sheets, forming internal electrodes on the plurality of piezoelectric composite sheets so as to prepare the plurality of piezoelectric composite sheets having the internal electrodes, laminating and pressing the plurality of piezoelectric composite sheets having the internal electrodes so as to generate a piezoelectric composite sheet laminate having the internal electrodes, and cutting the piezoelectric composite sheet laminate having the internal electrodes into a desired shape and size.

20 Claims, 6 Drawing Sheets

(51) Int. Cl.
   *H10N 30/088*  (2023.01)
   *H10N 30/092*  (2023.01)
   *H10N 30/857*  (2023.01)
   *H10N 30/87*   (2023.01)

(52) U.S. Cl.
   CPC ....... *H10N 30/092* (2023.02); *H10N 30/8536* (2023.02); *H10N 30/857* (2023.02); *H10N 30/877* (2023.02)

(58) Field of Classification Search
   CPC ............... H10N 30/857; H10N 30/877; H10N 30/067; H10N 30/853; H10N 30/8554; H10N 30/077; H10N 30/06; H10N 30/093; H10N 30/704
   See application file for complete search history.

(56) References Cited

U.S. PATENT DOCUMENTS

| | | | |
|---|---|---|---|
| 7,272,876 B2* | 9/2007 | Sumiya | H01G 4/30 29/25.35 |
| 2022/0393099 A1* | 12/2022 | Seo | C08K 5/12 |

OTHER PUBLICATIONS

Woo, Min Sik, et al. "Study on increasing output current of piezoelectric energy harvester by fabrication of multilayer thick film." Sensors and Actuators A: Physical 269 (2018): 524-534.

Korean Office Action issued on Sep. 21, 2023, in counterpart Korean Patent Application No. 10-2021-0124022 (4 pages in English, 6 pages in Korean).

* cited by examiner

METHOD FOR MANUFACTURING FLEXIBLE LAMINATED PIEZOELECTRIC COMPOSITE

CROSS REFERENCE TO RELATED APPLICATION

The present application claims priority to Korean Patent Application No. 10-2021-0124022, filed Sep. 16, 2021, the entire contents of which is incorporated herein for all purposes by this reference.

BACKGROUND OF THE INVENTION

Field of the Invention

The disclosure relates to a method for manufacturing a flexible laminated piezoelectric composite. More particularly, it relates to a method for manufacturing a laminated piezoelectric composite having excellent flexibility and piezoelectric properties by preparing large-scale flexible piezoelectric composite sheets through tape casting using a mixed slurry having a specific composition, forming internal electrodes on the piezoelectric composite sheets, and laminating and pressing the piezoelectric composite sheets.

Description of the Related Art

A piezoelectric ceramic is a material which enables interconversion between mechanical energy and electrical energy, and is being used in various devices, such as a haptic actuator, an ultrasonic sensor and an energy harvester. Particularly, a piezoelectric energy harvester uses vibration as an energy source in contrast to other forms of new renewable energy, and has an advantage in that it may be easily used in various places. Recently, a biodevice which supplies power to a wearable device using vibration of a human body is being spotlighted so as to maximize such an advantage of the piezoelectric energy harvester.

In order to apply the piezoelectric ceramic to various elements including the above-described piezoelectric energy harvester, flexibility should be essentially provided to the piezoelectric ceramic and, in order to provide flexibility to the piezoelectric ceramic, a composite acquired by mixing a polymer having excellent flexibility and a piezoelectric ceramic is generally used. In connection therewith, polydimethylsiloxane (PDMS) and polyvinylidene fluoride (PVDF) having flexibility and high piezoelectric properties compared to other polymers are mainly used as the polymer included in the composite, as disclosed in Korean Patent Registration No. 10-2042638 and Korean Patent Registration No. 10-1442632.

More recently, there are attempts to mass-produce various devices including the piezoelectric energy harvester, and thus, a method for mass-producing larger-scale piezoelectric composite elements is required. In order to produce the above-described sheet-type material on a large scale, a tape casting-based roll-to-roll process is mainly used. However, PDMS has a low glass transition temperature and thus does not have sufficient viscosity to produce a sheet through tape casting, and PVDF is not economically effective due to the high unit cost of PVDF and is not easy to be applied to a process for mass-producing sheets through tape casting due to toxicity of a fluorine component contained in PVDF.

Further, a piezoelectric composite including a polymer, such as PDMS or PVDF, has piezoelectric properties which are greater than general piezoelectric composites 5 including other polymers having piezoelectric properties, but is disadvantageous in that the absolute value of the piezoelectric coefficient $d_{33}$ of the piezoelectric composite including PDMS or PVDF as a polymer is not high. More concretely, the piezoelectric coefficients $d_{33}$ of the general piezoelectric composites are about 300 pC/N, but the piezoelectric coefficient $d_{33}$ of the piezoelectric composite including PDMS or PVDF as a polymer is about 10 to 20 pC/N.

SUMMARY OF THE INVENTION

Therefore, the present invention has been made in view of the above problems, and it is an object of the present invention to provide a method for manufacturing a laminated piezoelectric composite having excellent flexibility and piezoelectric properties by preparing a plurality of large-scale flexible piezoelectric composite sheets through a tape casting process using a slurry including polyvinyl butyral (PVB), which may be introduced into the tape casting process, a piezoelectric ceramic, a plasticizer, etc., forming internal electrodes on the piezoelectric composite sheets, and then laminating the piezoelectric composite sheets.

In accordance with the present invention, the above and other objects can be accomplished by the provision of a method for manufacturing a laminated piezoelectric composite, the method including wet-mixing ceramic powder, a polymer binder, a plasticizer and a solvent for 4 to 72 hours so as to generate a mixed slurry, a content of the polymer binder in the mixed slurry being 3 to 10 parts by weight, a content of the plasticizer in the mixed slurry being 0.1 to 3 parts by weight, and a content of the solvent in the mixed slurry being 30 to less than 50 parts by weight, based on 100 parts by weight of the ceramic powder in the mixed slurry, introducing the mixed slurry into a tape casting process so as to prepare a plurality of piezoelectric composite sheets, drying and forming the plurality of piezoelectric composite sheets using a roll-to-roll process so as to prepare the plurality of formed piezoelectric composite sheets, forming internal electrodes on the plurality of formed piezoelectric composite sheets so as to prepare the plurality of piezoelectric composite sheets having the internal electrodes, laminating and pressing the plurality of piezoelectric composite sheets having the internal electrodes so as to generate a piezoelectric composite sheet laminate having the internal electrodes, and cutting the piezoelectric composite sheet laminate having the internal electrodes into a desired shape and size.

The ceramic powder may include one selected from the group of lead zirconate titanate (PZT), lead magnesium niobate (PMN), lead manganese niobate (PMN), lead zinc niobate (PZN), lead nickel niobate (PNN), lead antimony niobate (PSN), lead copper niobate (PCN), lead zinc nickel niobate (PZNN), potassium sodium niobate (KNN), barium titanate (BT), sodium bismuth titanate (NBT) and combinations thereof.

A particle size of the ceramic powder may be 0.1 μm to 10 μm.

The polymer binder may be polyvinyl butyral (PVB).

The plasticizer may include one selected from the group consisting of dibutyl phthalate (DBP), diethylhexyl phthalate (DEHP), butylbenzyl phthalate (BBP), diisononyl phthalate (DINP), diisodecyl phthalate (DIDP) and combinations thereof.

The solvent may include one selected from the group consisting of methanol, ethanol, benzene, toluene, xylene and combinations thereof.

The content of the polymer binder in the mixed slurry may be equal to or less than 5 parts by weight, based on 100 parts by weight of the ceramic powder in the mixed slurry.

The content of the plasticizer in the mixed slurry may be equal to or less than 1 part by weight, based on 100 parts by weight of the ceramic powder in the mixed slurry.

The content of the solvent in the mixed slurry may be equal to or less than 45 parts by weight, based on 100 parts by weight of the ceramic powder in the mixed slurry.

The wet-mixing the ceramic powder, the polymer binder, the plasticizer and the solvent may include performing agitation and performing milling, in the performing the agitation, a mixture of the polymer binder, the plasticizer and the solvent may be generated, in the performing the milling, the ceramic powder may be ground and mixed with the mixture so as to generate the mixed slurry, the performing the agitation may include performing primary agitation at a rotational speed of 1,200 to 1,400 RPM for 1 to 3 hours, and performing secondary agitation at a rotational speed of 450 to 550 RPM for 10 to 15 hours, and the performing the milling may include performing primary milling at a rotational speed of 1,200 to 1,800 RPM for 10 minutes to 1 hour, and performing secondary milling at a rotational speed of 1,800 to 2,500 RPM for 1 to 2 hours.

The tape casting process may be performed at a speed of 0.5 to 3 m/min.

The drying the plurality of piezoelectric composite sheets may be performed at a temperature of 40 to 150° C.

The drying the plurality of piezoelectric composite sheets may be performed in three steps by varying a dying temperature, and an equation of Drying Temperature in First Step≤Drying Temperature in Second Step≤Drying Temperature in Third Step may be satisfied.

The internal electrodes may be formed of one selected from the group consisting of Ag, Cu, Pt, Ni, Pd, Au, W, Sn and combinations thereof.

In the forming the internal electrodes on the plurality of piezoelectric composite sheets, the internal electrodes may be formed by a screen printing process or an electroless plating process.

The electroless plating process may include generating an electrode pattern on the plurality of formed piezoelectric composite sheets by laser radiation.

The laser radiation may be performed under conditions of a power of 10 to 50 W, a radiation speed of 1,500 to 2,500 mm/s, a pulse width of 100 to 300 ns, and a frequency of 10 to 50 kHz.

The electrode pattern may be applied to an entire surface of each of the piezoelectric composite sheets, or may be an Inter Digital Electrode (IDE) pattern formed on each of the piezoelectric composite sheets.

The laminating and the pressing the plurality of piezoelectric composite sheets may be performed at a temperature of about 50 to 100° C. under a pressure of about 0.5 to 2 tons for 10 to 30 seconds.

The laminating and the pressing the plurality of piezoelectric composite sheets may be performed by a Cold Isostatic Pressing (CIP) process.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE INVENTION

Figure 1:
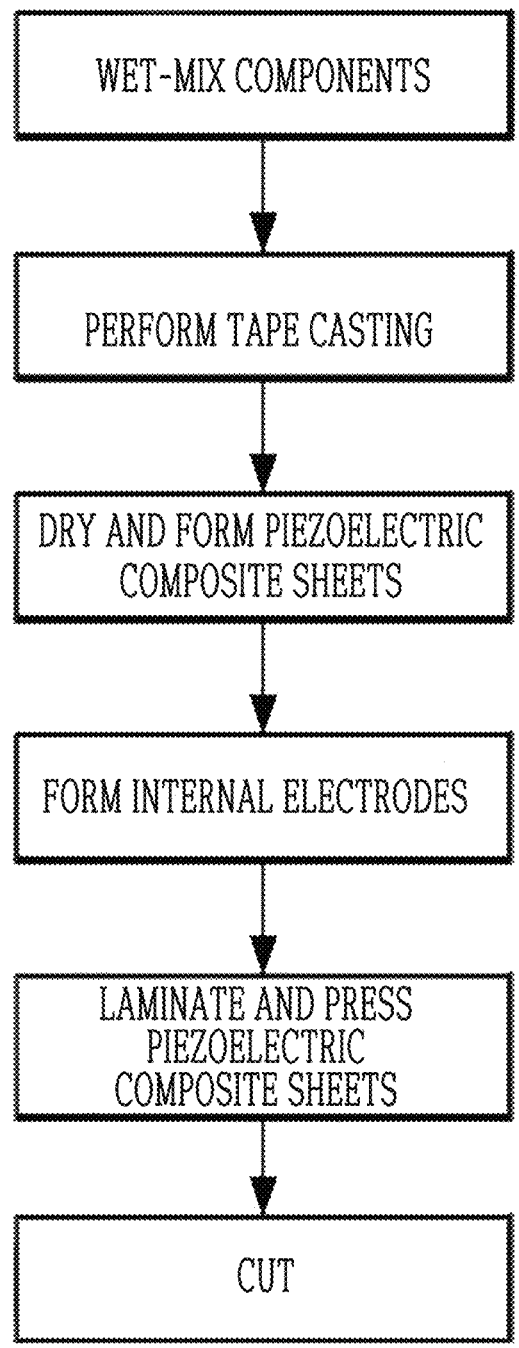
FIG. 1 is a schematic flowchart representing a method for manufacturing a laminated piezoelectric composite according to the disclosure.

Hereinafter, reference will be made in detail to various embodiments of the present invention, examples of which are illustrated in the accompanying drawings and described below.

One embodiment of the disclosure provides a method for manufacturing a laminated piezoelectric composite. Here, the laminated piezoelectric composite is a final product manufactured through a series of processes which will be described below, and indicates a product acquired by forming internal electrodes on at least two piezoelectric composite sheets essentially including a piezoelectric ceramic and a polymer binder, and then laminating the at least two piezoelectric composite sheets.

The above method may include wet-mixing ceramic powder, a polymer binder, a plasticizer and a solvent for 4 to 72 hours so as to generate a mixed slurry. The wet-mixing time may be 4 to 60 hours, 4 to 50 hours, 4 to 40 hours, 4 to 30 hours, 6 to 60 hours, 6 to 50 hours, 6 to 40 hours, 6 to 30 hours, 8 to 60 hours, 8 to 50 hours, 8 to 40 hours, 8 to 30 hours, 10 to 60 hours, 10 to 50 hours, 10 to 40 hours, 10 to 30 hours, 20 to 60 hours, 20 to 50 hours, 20 to 40 hours, or 20 to 30 hours. When the wet-mixing time is less than 4 hours, the respective components of the mixed slurry are not uniformly mixed and thus uniformity in the quality of the final product may not be secured, and, when the wet-mixing time exceeds 72 hours, the ceramic powder is excessively ground through a milling process and thus the particle size of the ceramic powder may be less than 0.1 μm, and the ceramic powder having the particle size of less than 0.1 μm has no piezoelectric properties.

Further, the upper limit of the particle size of the ceramic powder may be about 10 μm. When the thickness of the piezoelectric composite sheet in which an electrode pattern is formed by laser irradiation, which will be described below, is less than 10 μm, the damage rate of the sheet due to laser light during laser irradiation is increased, and thus, the proper thickness of the piezoelectric composite sheet prepared by tape casting is equal to or greater than about 10 μm. In consideration of the proper thickness of the piezoelectric composite sheet, when the particle size of the ceramic powder included in the sheet is 10 μm, the particle size of the ceramic powder is greater than the thickness of the sheet, there is a high possibility that defects, such as pin holes, occur. Further, the piezoelectric properties of ceramic are linearly increased in proportion to the particle size of the ceramic powder, but the piezoelectric properties of ceramic are saturated without being linearly increased after the particles of the ceramic powder reach a designated size (in general, 2 to 3 μm). Considering this point comprehensively, the upper limit of the particle size of the ceramic powder may be equal to or less than preferably 5 μm, and more preferably 3 μm.

The ceramic powder may be ceramic powder having piezoelectric properties, including one of lead zirconate titanate (PZT), lead magnesium niobate (PMN), lead manganese niobate (PMN), lead zinc niobate (PZN), lead nickel niobate (PNN), lead antimony niobate (PSN), lead copper niobate (PCN), lead zinc nickel niobate (PZNN) and combinations thereof, but the ceramic powder is not limited thereto and may include any ceramic powder having piezoelectric properties. Particularly, lead (Pb)-free ceramic powder including one of potassium sodium niobate (KNN), barium titanate (BT), sodium bismuth titanate (NBT) and combinations thereof may be more preferably used.

The polymer binder may be polyvinyl butyral (PVB). As described above, the piezoelectric properties (i.e., the piezoelectric coefficient $d_{33}$) of a polymer, such as PDMS or PVDF, are much lower than the piezoelectric properties (i.e., the piezoelectric coefficient $d_{33}$ (pC/N)) of the piezoelectric ceramic powder, but the polymer, such as PDMS or PVDF, is used to provide flexibility to a piezoelectric composite material in spite of loss of the piezoelectric properties, and the polymer, such as PDMS or PVDF, is not suitable for a sheet mass-production process through tape casting due to the above-described low glass transition temperature, high unit cost and toxicity thereof. In contrast, PVB has similar piezoelectric properties to PDMS and PVDF, but has a glass transmission temperature suitable for tape casting, and excellent corrosion resistance and heat resistance, and thus, the above-described mixed slurry including PVB may be applied to tape casting.

The plasticizer may include at least one selected from the group consisting of dibutyl phthalate (DBP), diethylhexyl phthalate (DEHP), butylbenzyl phthalate (BBP), diisononyl phthalate (DINP) and diisodecyl phthalate (DIDP), but the plasticizer is not limited thereto and may include any material which may provide plasticity suitable for tape casting to the mixed slurry, without being limited thereto.

The solvent is used to achieve uniform mixing of the components of the mixed slurry, in the operation of wet-mixing the respective components so as to generate the mixed slurry. The solvent may be one of polar solvents, such as methanol and ethanol, non-polar solvents, such as benzene, toluene and xylene, and combinations thereof, but the solvent is not limited thereto but may employ any solvent which may achieve uniform mixing of the components of the mixed slurry. However, since the solvent should be completely volatilized so as not to be included in the final product, i.e., the piezoelectric composite material, the solvent should be a material having a boiling point which is within a drying temperature range, i.e., within a temperature range of 40 to 150° C.

The content of the polymer binder in the mixed slurry may be 3 to 10 parts by weight, the content of the plasticizer in the mixed slurry may be 0.1 to 3 parts by weight, and the content of the solvent in the mixed slurry may be 30 to less than 50 parts by weight, based on 100 parts by weight of the ceramic powder in the mixed slurry.

More concretely, the content of the polymer binder in the mixed slurry may be 3 to 10 parts by weight, preferably, 4 to 8 parts by weight, more preferably, 4 to 7 parts by weight, and most preferably, 4 to 7 parts by weight, based on 100 parts by weight of the ceramic powder in the mixed slurry. Particularly, when the content of the polymer binder is less than 5 parts by weight, flexibility may be provided to the piezoelectric composite material which is the final product, while maintaining the piezoelectric properties of the piezoelectric composite material. When the content of the polymer binder is less than 3 parts by weight, it is not easy to achieve a desired level of flexibility of the piezoelectric composite material which is the final product, and, when the content of the polymer binder exceeds 10 parts by weight, the content of the piezoelectric ceramic powder in the final product is decreased, and thus, it is not easy to reach a desired level of piezoelectric properties.

The content of the plasticizer in the mixed slurry may be 0.1 to 3 parts by weight, preferably, 0.1 to 2 parts by weight, and more preferably, 0.1 to 1.5 parts by weight, based on 100 parts by weight of the ceramic powder in the mixed slurry, and the content of the plasticizer in the mixed slurry may be most preferably 0.1 to 1 part by weight from the point of view of providing suitability for the tape casting process while maintaining the strength of the piezoelectric composite material. When the content of the plasticizer is less than 0.1 parts by weight, plasticity of the mixed slurry may be low and thus it may not be easy to introduce the mixed slurry into tape casting, and, when the content of the plasticizer exceeds 3 parts by weight, the strength of the piezoelectric composite sheets prepared through tape casting using the mixed slurry may be reduced.

The content of the solvent in the mixed slurry may be 30 to less than 50 parts by weight, preferably, 40 to less than 50 parts by weight, and more preferably, 40 to 45 parts by weight, based on 100 parts by weight of the ceramic powder in the mixed slurry. When the content of the solvent is less than 30 parts by weight, the ceramic powder, the polymer binder and the plasticizer are not smoothly mixed during wet-mixing, and, when the content of the solvent is equal to or more than 50 parts by weight, it is not difficult to perform the tape casting process due to an excessive drop in viscosity of the mixed slurry.

In one example of implementation, the content of the polymer binder in the mixed slurry may be 5 to 30 parts by weight, preferably, 10 to 25 parts by weight, more preferably, 12 to 20 parts by weight, and most preferably, 15 to 18 parts by weight, based on 100 parts by weight of the solvent in the mixed slurry. When the content of the polymer binder in the mixed slurry is less than 5 parts by weight based on 100 parts by weight of the solvent in the mixed slurry, viscosity of the mixed slurry is reduced and thus the mixed slurry is not suitable for tape casting, and, when the content of the polymer binder in the mixed slurry exceeds 30 parts by weight, viscosity of the mixed slurry is excessively increased, the respective components in the mixed slurry are not uniformly mixed, and thus uniformity in the quality of the piezoelectric composite sheets, which will be prepared subsequently, may not be secured.

The operation of wet-mixing the respective components may include performing agitation and performing milling.

In the operation of performing the agitation, the polymer binder and the plasticizer are uniformly distributed in the solvent by agitating the polymer binder, the plasticizer and the solvent in an agitator at a designated rotational speed, and the agitation may be performed in two steps by varying the rotational speed. Primary agitation may be performed at a rotational speed of 1,200 to 1,400 RPM for 1 to 3 hours, and secondary agitation may be performed at a rotational speed of 450 to 550 RPM for 10 to 15 hours. The polymer binder and the plasticizer may be uniformly distributed in the solvent through the above two-step agitation.

In the operation of performing the milling, the ceramic powder is added to a mixture of the polymer binder, the plasticizer and the solvent, acquired by the operation of performing the agitation, and the corresponding ceramic powder is ground to have a desired particle size so as to prepare the mixed slurry in which the ceramic powder is uniformly distributed in the mixture, and the milling of the mixture is preferably performed using a basket mill, without being limited thereto, and may be performed using any apparatus suitable for wet-milling. The milling of the mixture may also be performed in two steps by varying a rotational speed. Primary milling may be performed at a rotational speed of 1,200 to 1,800 RPM for 10 minutes to 1 hour, and secondary milling may be performed at a rotational speed of 1,800 to 2,500 RPM for 1 to 2 hours. The ceramic powder may also be ground to have a uniform particle size through the above two-step milling, and may thus be uniformly distributed in the mixture of the polymer binder, the plasticizer and the solvent.

In one example of implementation, the operation of performing the milling may be performed after the operation of agitation. As described above, the piezoelectric properties of the ceramic powder according to the disclosure are remarkably reduced when the ceramic powder having a particle size of less than 1 μm, and, when the ceramic powder is first milled to have a desired particle size and is then agitated with the polymer binder, the plasticizer and the solvent, the ceramic power may be additionally ground during agitation, and thus, in order to prevent such a problem, the polymer binder, the plasticizer and the solvent may be first agitated and then the ceramic powder may be mixed with the mixture through milling.

Figure 2:
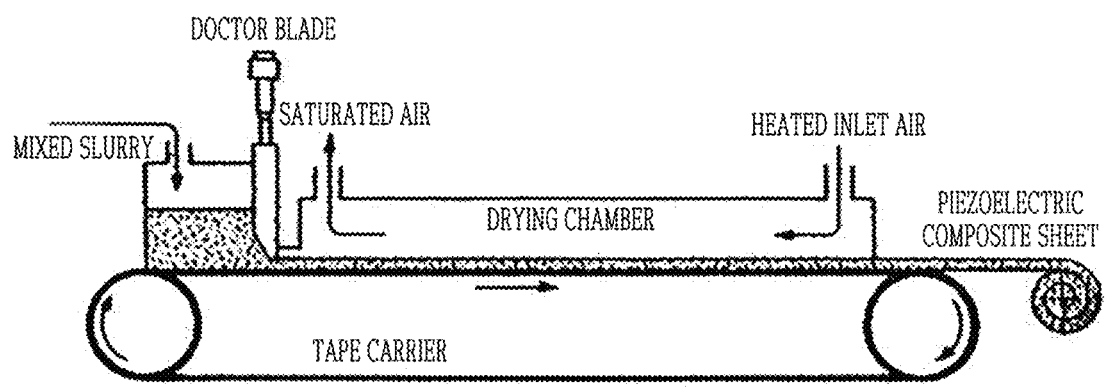
FIG. 2 is a schematic view showing an apparatus used in a tape casting process according to the disclosure.

The above method may include introducing the mixed slurry into the tape casting process so as to prepare a plurality of piezoelectric composite sheets. In one example of implementation, the piezoelectric composite sheets may be sheets having an area of about 200 mm in width and about 5 m in length. The tape casting process may be performed using an apparatus shown in FIG. 2, and concretely, the tape casting process is performed by feeding the mixed slurry, treating the mixed slurry with heated inlet air through a tape carrier while controlling the thickness of a sheet prepared through control of the height of a doctor blade, so as to prepare a tape-type sheet.

Here, the progress speed of the tape carrier (i.e., a tape casting speed) may be 0.5 to 3 m/min, preferably 1 to 2.5 m/min, more preferably, 1 to 2 m/min, and most preferably, 1 to 1.5 m/min. When the tape casting speed is less than 0.5 m/min, minimum shear stress required to prepare a piezoelectric composite sheet is not supplied and thus unevenness may be formed on the surface of the prepared piezoelectric composite sheet and quality of the surface of the piezoelectric composite sheet may not be uniform, and, when the tape casting speed exceeds 3 m/min, excessively high shear stress is supplied to the piezoelectric composite sheet and thus the sheet may be cut.

The piezoelectric composite sheets prepared through tape casting may be dried and formed through a roll-to-roll process simultaneously with casting or after casting.

In the roll-to-roll process, the piezoelectric composite sheet is applied to a flexible film, such as a PVC film, through rollers, and is dried and formed, and the piezoelectric composite sheet according to the disclosure includes the polymer binder, such as PVB, and thus has flexibility, as described above, and may thus be introduced into the roll-to-roll process. Roll-to-roll equipment may be designed not only on a lab-scale but also on a larger-scale, and is thus suitable for manufacture of a large-scale piezoelectric composite material provided as an object of the disclosure.

The operation of drying and forming the piezoelectric composite sheets may be performed at a temperature of 40 to 150° C., and the solvent having a boiling point, which is within the above temperature range, is completely volatilized by the operation of drying and forming the piezoelectric composite sheets.

More concretely, the operation of drying and forming the piezoelectric composite sheets may be performed in three steps by varying a dying temperature. The operation of drying and forming the piezoelectric composite sheets may be performed so as to satisfy an equation of Drying Temperature in First Step≤Drying Temperature in Second Step≤Drying Temperature in Third Step. The drying of the piezoelectric composite sheets in the first step may be performed at a temperature of 40 to 80° C., the drying of the piezoelectric composite sheets in the second step may be performed at a temperature of 60 to 120° C., and the drying of the piezoelectric composite sheets in the third step may be performed at a temperature of 100 to 150° C. Through the above-described three-step drying of the piezoelectric composite sheets, damage to the piezoelectric composite sheets due to rapid temperature rise and lift of the sheet during the tape casting process may be prevented.

The above method may not include performing burnout and sintering. The conventional process for manufacturing a piezoelectric composite material includes volatilizing a polymer binder and a solvent remaining in piezoelectric composite sheets and sintering ceramic powder by placing the piezoelectric composite sheets at a temperature higher than hundreds of ° C. or 1,000° C., after preparing the piezoelectric composite sheets. In contrast, since the method according to the disclosure does not include performing burnout and sintering, the laminated piezoelectric composite which is the final product may include the polymer binder, and thereby, may have flexibility suitable for wearable devices while being manufactured on a large scale.

The above method may include forming internal electrodes on the plurality of piezoelectric composite sheets so as to form the piezoelectric composite sheets having the internal electrodes.

The internal electrodes function as electrodes, and provide higher piezoelectric properties to the piezoelectric composite sheets, simultaneously. The internal electrodes may be formed of one selected from the group consisting of Ag, Cu, Pt, Ni, Pd, Au, W, Sn and combinations thereof, but the internal electrodes are not limited thereto and may employ any metal which may be formed in a regular pattern on the piezoelectric composite sheets without being limited thereto.

Formation of the internal electrodes is not limited to a specific method, and the internal electrodes may be formed by a screen printing process or an electroless plating process from the point of view of formation of an pattern in the sheet-type piezoelectric composite material which is mass-produced.

The screen printing process may include forming alignment holes in the piezoelectric composite sheets, masking the piezoelectric composite sheets with a screen mask based on the alignment holes, printing an electrode paste on the piezoelectric composite sheets through the screen mask, removing the screen mask, and drying the printed electrode paste.

The alignment holes serve to form the internal electrodes at the same positions of the respective piezoelectric composite sheets when the piezoelectric composite sheets are laminated, and may be generally formed using a punch, without being limited thereto. Further, when the piezoelectric composite sheets are square-shaped, the alignment holes are generally formed at the four corners of the respective piezoelectric composite sheets.

After the piezoelectric composite sheets having the alignment holes formed therein have been masked with the screen mask designed such that a desired electrode pattern is printed on the piezoelectric composite sheets, the electrode paste is printed on the piezoelectric composite sheets through the screen mask, and in this case, printing of the electrode paste is performed under a pressure of about 50 to 300 kPa at room temperature. When the printing pressure is less than 50 kPa, the electrode paste is not capable of passing through pattern holes formed in the screen mask and thus unprinted regions may occur on the piezoelectric composite sheets, and, when the printing pressure exceeds 300 kPa, the screen mask may be deformed and the electrode paste may be excessively smudged on the piezoelectric composite sheets. After printing of the electrode paste on the piezoelectric composite sheets has been completed, the screen mask is removed.

The piezoelectric composite sheets printed with the electrode paste are dried at a temperature of about 80° C., and a solvent remaining in the electrode paste is removed by drying.

As described above, the internal electrodes may also be formed by the electroless plating process, and the electroless plating process may include forming alignment holes in the piezoelectric composite sheets, forming an electrode pattern in the piezoelectric composite sheets having the alignment holes, and immersing the piezoelectric composite sheets having the alignment holes in a plating solution.

Here, the alignment holes are formed in the same way for the same purpose as in the above-described screen printing process.

Figure 3A:
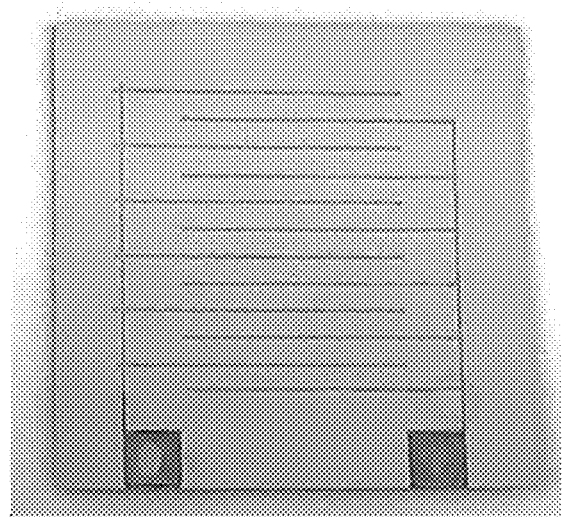
FIGS. 3A and 3B are scanning electron microscope (SEM) images of the surface structure and the cross-sectional microstructure of the laminated piezoelectric composite in which internal electrodes are formed by electroless plating after formation of an electrode pattern by laser irradiation according to the disclosure.
Figure 3B:
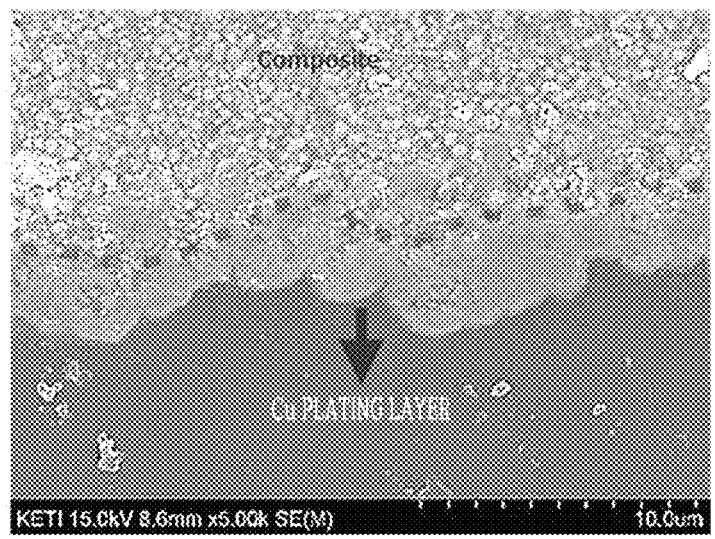

In the operation of forming the electrode pattern on the piezoelectric composite sheets having the alignment holes, formation of the electrode pattern is not limited to a specific method, and may be performed by laser radiation. Laser light is radiated to the same positions of the respective piezoelectric composite sheets depending on the electrode pattern to be formed based on the alignment holes, and parts of the piezoelectric composite sheets to which the laser light is radiated are excited. The laser light may be radiated at a power of about 10 to 50 W, preferably, about 15 to 40 W, and more preferably, about 20 to 30 W, at a radiation speed of about 1,500 to 2,500 mm/s, preferably, about 1,800 to 2,200 mm/s, and more preferably, about 2,000 to 2,100 mm/s, at a pulse width of about 100 to 300 ns, preferably, about 120 to 250 ns, more preferably, abut 150 to 200 ns, and at a frequency of about 10 to 50 kHz, preferably, about 15 to 40 kHz, and more preferably, about 20 to 30 kHz. When the laser power is less than 15 W, the piezoelectric composite sheets are not sufficiently excited and thus it may be difficult to form the electrode pattern on the piezoelectric composite sheets, and, when the laser power exceeds 40 W, the piezoelectric composite sheets may be damaged due to laser radiation. Further, when laser radiation is performed under conditions of a radiation speed of less than 1,500 mm/s, a pulse width of less than 100 ns, and a frequency exceeding 50 kHz, the laser light is concentrated upon specific positions of the piezoelectric composite sheets and may thus cause damage to the piezoelectric composite sheets, and, when laser radiation is performed under conditions of a radiation speed exceeding 2,500 mm/s, a pulse width exceeding 300 ns, and a frequency of less than 10 kHz, the laser light is radiated in the form of pulse dots and thus it may be difficult to form a continuous pattern. FIGS. 3A and 3B are scanning electron microscope (SEM) images respectively showing the surface structure and the cross-sectional microstructure of a laminated piezoelectric composite by laminating and pressing piezoelectric composite sheets having Cu internal electrodes formed thereon, acquired by forming an inter digital electrode pattern on piezoelectric composite sheets by radiating laser light thereto under conditions of a power of 20 W, a radiation speed of 2,000 mm/s, a pulse width of 200 ns and a frequency of 20 kHz, and immersing the piezoelectric composite sheets in a Cu plating solution.

After the operation of forming the electrode pattern, the plurality of piezoelectric composite sheets are immersed in the plating solution. The plating solution may include ions of a metal which forms the electrodes, and may further include additives, such as a complex agent. In general, in the case of general electroless plating, a plating solution includes a reductant so that metal ions in the plating solution are reduced on the surface of an object to be plated, instead of use of a power supply, but, in the case of the piezoelectric composite sheets having the electrode pattern formed thereon by laser radiation, the parts of the piezoelectric composite sheets, to which laser light is radiated, are in the excited state and mobility of electrons is increased in these parts, and thus, it is easy to reduce metal ions in the plating solution by providing electrons to the metal ions when the sheets are immersed in the plating solution, and therefore, a separate reductant may be omitted from the plating solution. The temperature of the plating solution in which the sheets are immersed may be 50 to 80° C. When the temperature of the plating solution is lower than 50° C., activation energy for ion adsorption may be insufficient, and, when the temperature of the plating solution is higher than 80° C., the sheets may be deformed and damaged. Further, the immersion time of the piezoelectric composite sheets may be 5 to 20 minutes. When the immersion time is less than 5 minutes, it is difficult to adsorb the ions onto the piezoelectric composite sheets, and, when the immersion time exceeds 20 minutes, parts of the piezoelectric composite sheets other than the parts of the piezoelectric composite sheets having the pattern formed thereon by laser radiation may be plated due to excessive ion adsorption.

The electrode pattern formed in the operation of forming the internal electrodes may be any electrode pattern, which may provide piezoelectric properties to the piezoelectric composite which will be manufactured, preferably, may be applied to the entire surface of each of the piezoelectric composite sheets or may be an inter digital electrode pattern formed on each of the piezoelectric composite sheets, and more preferably, may be an inter digital pattern having excellent piezoelectric properties represented by an excellent piezoelectric coefficient $d_{33}$, when the piezoelectric composite is applied to bending.

The above method may include laminating and pressing the plurality of piezoelectric composite sheets having the internal electrodes formed thereon so as to generate a piezoelectric composite sheet laminate having the internal electrodes formed therein. When the piezoelectric composite sheets are laminated into the piezoelectric composite sheet laminate, the piezoelectric composite sheets exhibit the intensity of polarization per unit area which is increased in proportion to the number of the laminated piezoelectric composite sheets due to the internal electrodes, and thus have higher piezoelectric properties than piezoelectric composite sheets without internal electrodes.

The operation of laminating and pressing the piezoelectric composite sheets may be performed at a temperature of about 50 to 100° C., preferably, about 60 to 90° C., and more preferably, about 70 to 80° C., under a pressure of about 0.5 to 2 tons, preferably, about 0.7 to 1.8 tons, and more preferably, about 1.0 to 1.5 tons, for a time of about 10 to 30 seconds, preferably, about 12 to 25 seconds, and more preferably, about 15 to 20 seconds. In the operation of laminating and pressing the piezoelectric composite sheets, a temperature at which the piezoelectric composite sheets are laminated and pressed is particularly important. Sufficient adhesion between the sheets is not performed at a temperature of less than 60° C., and a plasticizer component partially added into the polymer is destroyed and thus flexibility of the piezoelectric composite which will be manufactured may be remarkably reduced at a temperature exceeding 90° C.

Further, the operation of laminating and pressing the piezoelectric composite sheets may be performed by a Cold Isostatic Pressing process (hereinafter, referred to as a CIP process). The CIP process is a processing method in which the piezoelectric composite sheets having the internal electrodes are sealed in a pressure vessel, and then, the piezoelectric composite sheets having the internal electrodes are compactly laminated by applying uniform pressure to all parts of the pressure vessel by a fluid. According to the CIP process, the same pressure is applied to all the parts of the pressure vessel, the same pressure is uniformly applied to the piezoelectric composite sheets having the internal electrodes in the pressure vessel in all directions, and thus, all parts of the manufactured piezoelectric composite sheet laminate having the internal electrodes uniformly exhibit piezoelectric properties, and therefore, the CIP process is advantageous in that it may increase uniformity in the quality of the piezoelectric composite. Further, according to the CIP process, an air layer present between the respective laminated sheets may be removed, and thus, a contact failure between the respective sheets may be prevented. Since the CIP process is performed at room temperature to a temperature of 80° C. using water as the fluid, the CIP process is difficult to perform at a temperature lower than room temperature, and may damage the polymer in the sheets at a temperature higher than 80° C. Further, the CIP process may be performed under a pressure of 2 to 10 bar, a pressure lower than 2 bar is similar to atmospheric pressure and thus pressing effects are low under this pressure, and a pressure higher than 10 bar exceeds the limit pressure of CIP process equipment and thus it is difficult to implement this pressure. Such a CIP process is generally performed for about 10 minutes.

The above method may include cutting the piezoelectric composite sheet laminate having the internal electrodes into a desired shape and size. The laminated piezoelectric composite having the desired shape and size acquired by cutting the piezoelectric composite sheet laminate may have the following properties.

The laminated piezoelectric composite manufactured by the above method may have tensile strength equal to or greater than 5 MPa, preferably, equal to or greater than 6 MPa, and more preferably, equal to or greater than 7 MPa. Further, the laminated piezoelectric composite may have an elongation equal to or greater than 15%, preferably, equal to or greater than 18%, more preferably, equal to or greater than 20%, and most preferably, equal to or greater than 23%. The laminated piezoelectric composite having the above-described tensile strength and elongation may have flexibility suitable for use in wearable devices.

Hereinafter, the disclosure will be described in more detail through the following examples. The following examples serve merely to exemplarily describe the present invention, and are not intended to limit the scope of the disclosure.

1. Manufacture of Piezoelectric Composite Sheets

Commercial PZT-based ceramic powder and a commercial polymer binder solution including a plasticizer and ethanol serving as a solvent were weighed in a weight ratio of 60:40, and were wet-mixed together with zirconia balls in a nylon jar for 12 hours. A piezoelectric composite sheet having a thickness of 30 to 33 μm was formed by applying a mixed slurry prepared through wet-mixing to a PVC film coated with silicon (Si) using tape casting equipment. While formation of the piezoelectric composite sheet was performed, ethanol serving as the solvent was completely volatilized by drying the piezoelectric composite sheet. Hereinafter, the piezoelectric composite sheet was cut into square-shaped sheets having a size of 10 cm×10 cm.

Figure 4A:
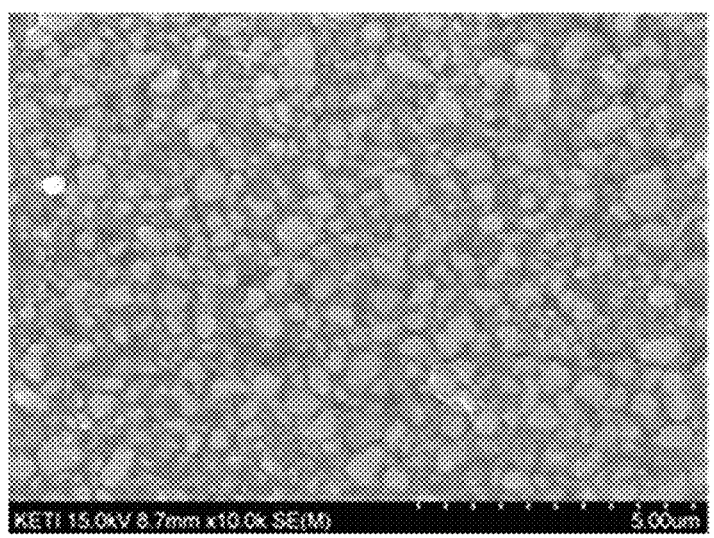
FIGS. 4A and 4B are SEM images of the microstructure of a piezoelectric composite sheet manufactured according to the disclosure.
Figure 4B:
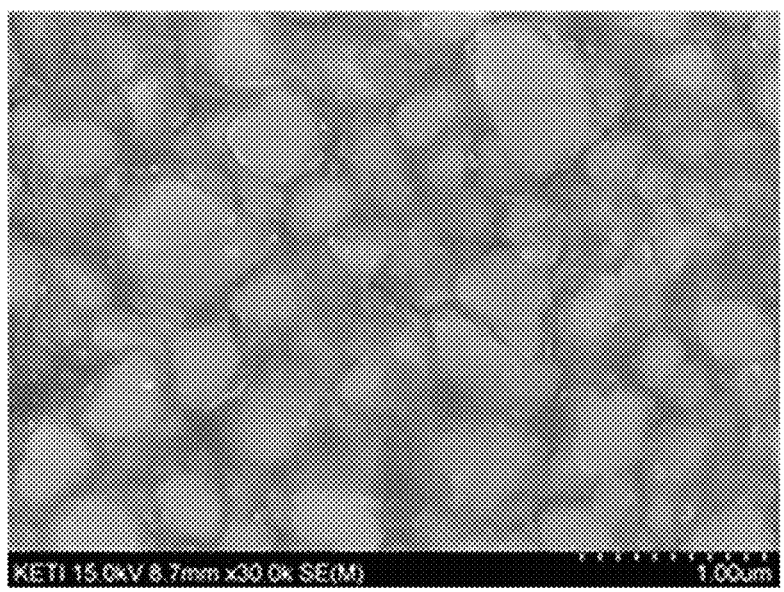

FIGS. 4A and 4B shows the internal microstructure of the above-described piezoelectric composite sheet. Referring to FIGS. 4A and 4B, it may be confirmed that the microstructure of the piezoelectric composite sheet was configured such that PZT-based ceramic powder particles were uniformly distributed in a PVB-based polymer matrix, and a general 0-3 piezoelectric composite material (i.e., ceramic polymer composite) was formed.

2. Test Example 1

Measurement of Tensile Strength and Elongation of Piezoelectric Composite Material Three piezoelectric composite materials (Samples 1 to 3) were manufactured by laminating 40 piezoelectric composite sheets having thicknesses of 31 μm, 32 μm and 33 μm, respectively, manufactured according to the above-described manufacturing method (the method described in 1. Manufacture of Piezoelectric Composite Sheets), after removing a PVC film therefrom, and then pressing the laminated piezoelectric composite sheets at a temperature of 65° C. Tensile stress was applied to the manufactured Samples 1 to 3 using a tensile and compression tester, tensile stresses, i.e., tensile strengths representing tensile stress at a point in time when Samples 1 to 3 were broken and elongations representing the degrees of maximum elongation of Samples 1 to 3 before being broken were measured, and results thereof are set forth in Table 1 below.

TABLE 1

Tensile strengths and elongations of Samples 1 to 3

| Sample No. | Thickness (μm) | Tensile strength (MPa) | Elongation (%) |
| --- | --- | --- | --- |
| 1 | 31 | 8.18 | 23.70 |
| 2 | 32 | 7.92 | 23.97 |
| 3 | 33 | 8.23 | 24.46 |

As set forth in Table 1 above, it was observed that all of Samples 1 to 3 exhibited excellent tensile strengths of about 8 MPa and very high elongations of about 24%, and thus have sufficient flexibility to be applied to wearable devices.

In order to measure piezoelectric properties of the piezoelectric composite material having flexibility applicable to wearable devices according to Manufacturing Example 1 of the disclosure, the following additional samples were manufactured, and tests on these samples were performed.

3. Manufacturing Example 1

Laminated Piezoelectric Composite

Figure 5A:
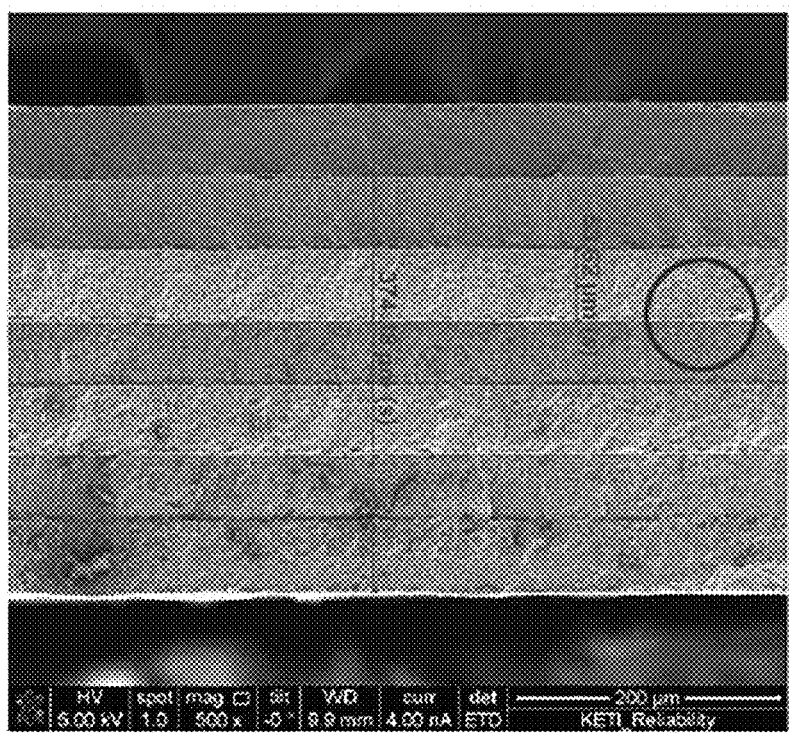
FIGS. 5A to 5C are SEM images of the microstructure of a laminated piezoelectric composite manufactured according to one Manufacturing Example of the disclosure.
Figure 5B:
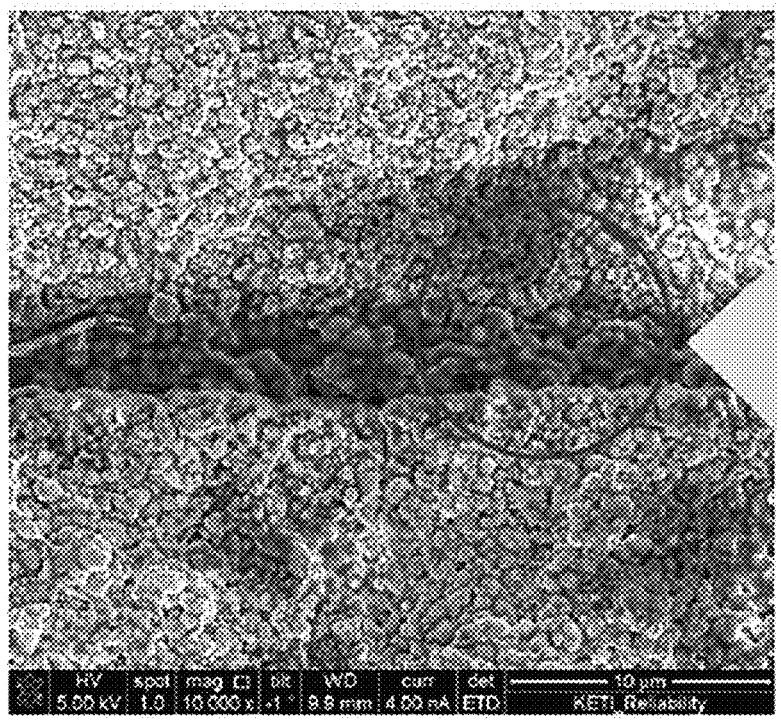
Figure 5C:
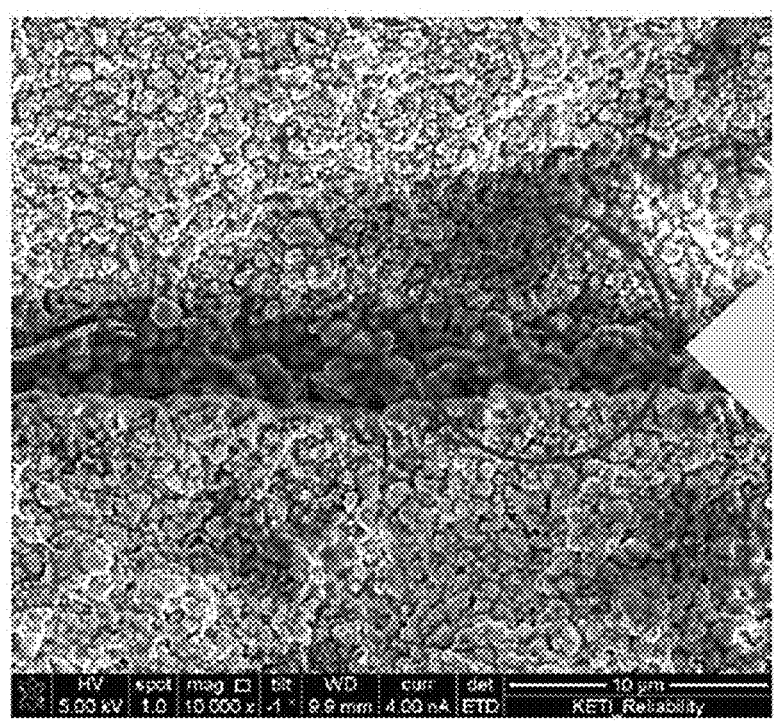

Alignment holes were formed at the four corners of each of seven square piezoelectric composite sheets manufactured according to the above-described manufacturing method (the method described in 1. Manufacture of Piezoelectric Composite Sheets), using a punch. Each of the respective piezoelectric composite sheets was masked with a screen mask based on the alignment holes so as to form a designated electrode pattern, and then, internal electrodes were formed by printing an Ag electrode paste on each of the respective piezoelectric composite sheets. Thereafter, the seven piezoelectric composite sheets having the internal electrodes formed thereon were aligned based on the alignment holes, and were laminated and pressed, and then, the piezoelectric composite sheets were sealed in a pressure vessel and were additionally pressed at a temperature of 50° C. under a pressure of 6 bar for 10 minutes through the CIP process using a CIP machine, thereby manufacturing a final laminated piezoelectric composite. FIGS. 5A to 5C show the microstructure of the laminated piezoelectric composite. FIG. 5B is an enlarged image showing the microstructure of a portion of FIG. 5A, represented by a circle, and FIG. 5C is an enlarged image showing the microstructure of a portion of FIG. 5B, represented by a circle.

4. Comparative Manufacturing Example 1

Laminated Piezoelectric Composite

A laminated piezoelectric composite was manufactured by laminating and pressing seven piezoelectric composite sheets, manufactured according to the above-described manufacturing method (the method described in 1. Manufacture of Piezoelectric Composite Sheets), through the CIP process under the same process conditions as in Manufacturing Example 1, without forming separate internal electrodes on the piezoelectric composite sheets.

5. Test Example 2

Figure 6:
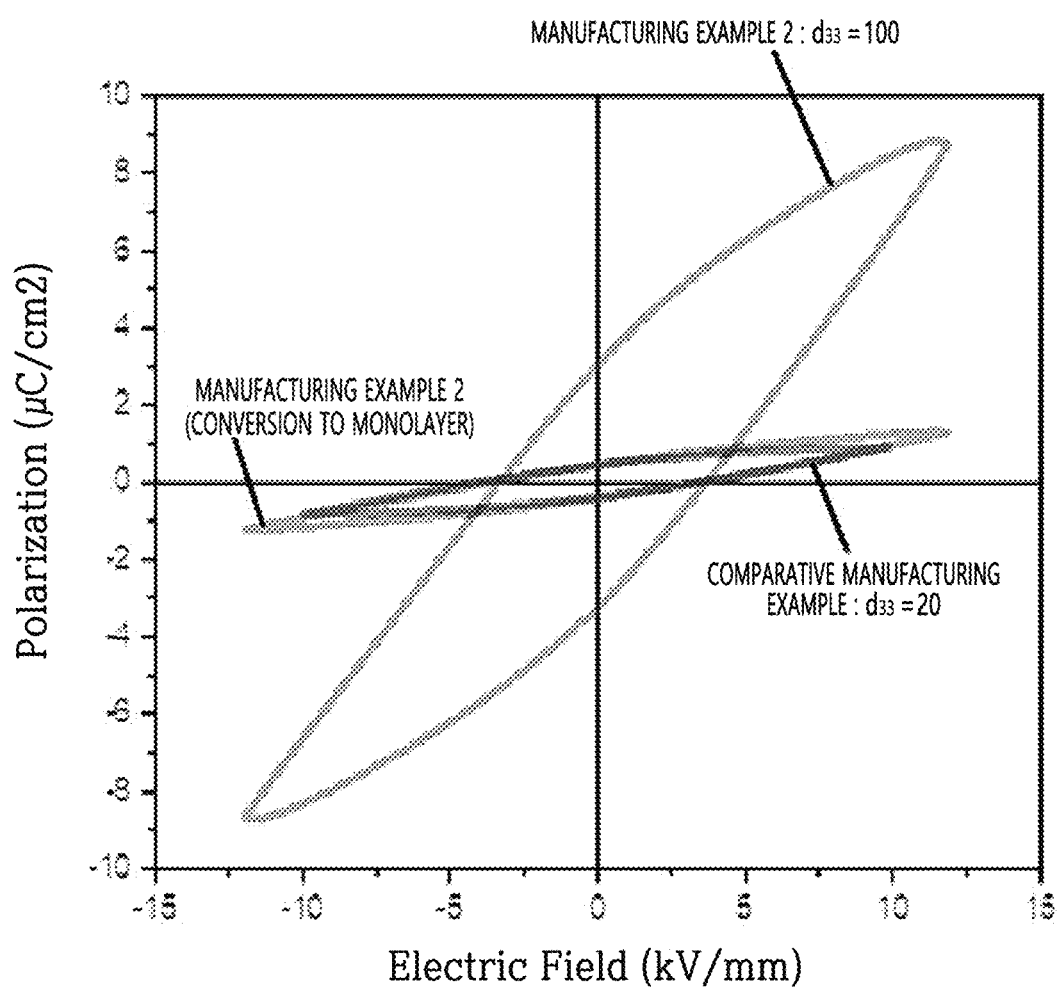
FIG. 6 is a graph representing hysteresis loops of polarizations of samples in one Manufacturing Example and one Comparative Manufacturing Example to an electric field, measured according to one embodiment of the disclosure.

Comparison of Piezoelectric Properties Between Laminated Piezoelectric Composites Ferroelectric properties of the sample manufactured according to Manufacturing Example 1 and the sample manufactured according to Comparative Manufacturing Example 1, represented by P-E loops, were confirmed, and piezoelectric properties of the two samples, represented by piezoelectric coefficients $d_{33}$, after polarization by applying an electric field of 4 kV/mm to the two samples for 1 hour in Si oil at a temperature of 0° C. were confirmed. FIG. 6 is a graph representing hysteresis loops acquired by the above measurement.

Referring to FIG. 6, when the applied electric field is removed, i.e., the electric field returns to 0 after application of the electric field, it was observed that the sample according to Manufacturing Example 1 had a remnant polarization of about 2.4 μC/mm, and thus exhibited excellent ferroelectric properties, compared to the sample according to Comparative Manufacturing Example 1 which exhibited a remnant polarization of about 0.3 μC/mm under the same conditions.

Further, in FIG. 6, as a result of conversion from the degree of polarization of the sample according to Manufacturing Example 1 to a value regarding a monolayer, a polarization of about 0.35 μC/mm was acquired, i.e., a value of about 1/7 of the degree of polarization of the piezoelectric composite manufactured by laminating the seven piezoelectric composite sheets was acquired. Thereby, it may be confirmed that, in the case of a laminated piezoelectric composite formed by laminating piezoelectric composite sheets having internal electrodes formed thereon, the degree of polarization of the laminated piezoelectric composite per unit area is increased in proportion to the number of the piezoelectric composite sheets which are laminated.

That is, the laminated piezoelectric composite manufactured according to Manufacturing Example 1 of the disclosure may be manufactured on a large scale through the tape casting process, may have flexibility based on the piezoelectric composite sheets including PVB as a binder, and may exhibit excellent piezoelectric properties due to the internal electrodes, thereby being suitable for application as a power supply of a wearable device and a biodevice.

As is apparent from the above description, the disclosure provides a method for manufacturing a flexible laminated piezoelectric composite on a large scale, compared to the conventional piezoelectric composite using PDMS or PVDF as a polymer binder, which is capable of being manufactured on a lab scale. Further, piezoelectric composite sheets prepared by the method according to the disclosure may be applied directly to a roll-to-roll process, and may be easily mass-produced due to use of PVB, which is cheaper than PDMS and PVDF, as a polymer binder, thus being economically beneficial. Moreover, the piezoelectric composite manufactured by the method includes internal electrodes formed therein, and has piezoelectric properties which are increased in proportion to the number of the laminated piezoelectric composite sheets, thereby being capable of exhibiting greatly improved piezoelectric properties compared to the conventional piezoelectric composite without internal electrodes.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method for manufacturing a laminated piezoelectric composite, the method comprising:
   wet-mixing ceramic powder, a polymer binder, a plasticizer and a solvent for 4 to 72 hours so as to generate a mixed slurry, a content of the polymer binder in the mixed slurry being 3 to 10 parts by weight, a content of the plasticizer in the mixed slurry being 0.1 to 3 parts by weight, and a content of the solvent in the mixed slurry being 30 to 50 parts by weight, based on 100 parts by weight of the ceramic powder in the mixed slurry;

introducing the mixed slurry into a tape casting process so as to prepare a plurality of piezoelectric composite sheets;

drying and forming the plurality of piezoelectric composite sheets using a roll-to-roll process so as to prepare the plurality of formed piezoelectric composite sheets;

forming internal electrodes on the plurality of formed piezoelectric composite sheets so as to prepare the plurality of piezoelectric composite sheets having the internal electrodes;

laminating and pressing the plurality of piezoelectric composite sheets having the internal electrodes so as to generate a piezoelectric composite sheet laminate having the internal electrodes; and cutting the piezoelectric composite sheet laminate having the internal electrodes into a desired shape and size.

2. The method according to claim 1, wherein the ceramic powder comprises one selected from the group of lead zirconate titanate (PZT), lead magnesium niobate (PMN), lead manganese niobate (PMN), lead zinc niobate (PZN), lead nickel niobate (PNN), lead antimony niobate (PSN), lead copper niobate (PCN), lead zinc nickel niobate (PZNN), potassium sodium niobate (KNN), barium titanate (BT), sodium bismuth titanate (NBT) and combinations thereof.

3. The method according to claim 1, wherein a particle size of the ceramic powder is 0.1 μm to 10 μm.

4. The method according to claim 1, wherein the polymer binder is polyvinyl butyral (PVB).

5. The method according to claim 1, wherein the plasticizer comprises one selected from the group consisting of dibutyl phthalate (DBP), diethylhexyl phthalate (DEHP), butylbenzyl phthalate (BBP), diisononyl phthalate (DINP), diisodecyl phthalate (DIDP) and combinations thereof.

6. The method according to claim 1, wherein the solvent comprises one selected from the group consisting of methanol, ethanol, benzene, toluene, xylene and combinations thereof.

7. The method according to claim 1, wherein the content of the polymer binder in the mixed slurry is equal to or less than 5 parts by weight, based on 100 parts by weight of the ceramic powder in the mixed slurry.

8. The method according to claim 1, wherein the content of the plasticizer in the mixed slurry is equal to or less than 1 part by weight, based on 100 parts by weight of the ceramic powder in the mixed slurry.

9. The method according to claim 1, wherein the content of the solvent in the mixed slurry is equal to or less than 45 parts by weight, based on 100 parts by weight of the ceramic powder in the mixed slurry.

10. The method according to claim 1, wherein the wet-mixing the ceramic powder, the polymer binder, the plasticizer and the solvent comprises performing agitation and performing milling, wherein, in the performing the agitation, a mixture of the polymer binder, the plasticizer and the solvent is generated, and, in the performing the milling, the ceramic powder is ground and is then mixed with the mixture so as to generate the mixed slurry, wherein:

the performing the agitation comprises performing primary agitation at a rotational speed of 1,200 to 1,400 RPM for 1 to 3 hours, and performing secondary agitation at a rotational speed of 450 to 550 RPM for 10 to 15 hours; and the performing the milling comprises performing primary milling at a rotational speed of 1,200 to 1,800 RPM for 10 minutes to 1 hour, and performing secondary milling at a rotational speed of 1,800 to 2,500 RPM for 1 to 2 hours.

11. The method according to claim 1, wherein the tape casting process is performed at a speed of 0.5 to 3 m/min.

12. The method according to claim 1, wherein the drying the plurality of piezoelectric composite sheets is performed at a temperature of 40 to 150° C.

13. The method according to claim 1, wherein the drying the plurality of piezoelectric composite sheets is performed in three steps by varying a dying temperature, wherein an equation of Drying Temperature in First Step≤Drying Temperature in Second Step≤Drying Temperature in Third Step is satisfied.

14. The method according to claim 1, wherein the internal electrodes are formed of one selected from the group consisting of Ag, Cu, Pt, Ni, Pd, Au, W, Sn and combinations thereof.

15. The method according to claim 1, wherein, in the forming the internal electrodes on the plurality of piezoelectric composite sheets, the internal electrodes are formed by a screen printing process or an electroless plating process.

16. The method according to claim 15, wherein the electroless plating process comprises generating an electrode pattern on the plurality of formed piezoelectric composite sheets by laser radiation.

17. The method according to claim 16, wherein the laser radiation is performed under conditions of a power of 10 to 50 W, a radiation speed of 1,500 to 2,500 mm/s, a pulse width of 100 to 300 ns, and a frequency of 10 to 50 kHz.

18. The method according to claim 16, wherein the electrode pattern is applied to an entire surface of each of the piezoelectric composite sheets, or is an Inter Digital Electrode (IDE) pattern formed on each of the piezoelectric composite sheets.

19. The method according to claim 1, wherein the laminating and the pressing the plurality of piezoelectric composite sheets are performed at a temperature of about 50 to 100° C. under a pressure of about 0.5 to 2 tons for 10 to 30 seconds.

20. The method according to claim 1, wherein the laminating and the pressing the plurality of piezoelectric composite sheets are performed by a Cold Isostatic Pressing (CIP) process.

* * * * *